United States Patent [19]
Kempter et al.

[11] Patent Number: 4,809,014
[45] Date of Patent: Feb. 28, 1989

[54] APPARATUS FOR AND METHOD OF POSITIONING AND SYNCHRONIZING A WRITING LASER BEAM

[75] Inventors: Meinrad Kempter, Lyss, Switzerland; Elko Doering, Morigen, Fed. Rep. of Germany

[73] Assignee: Lasarray Holding AG, Thundorf, Switzerland

[21] Appl. No.: 108,444

[22] Filed: Sep. 22, 1987

[30] Foreign Application Priority Data

Sep. 22, 1986 [CH] Switzerland ............. 03781/86

[51] Int. Cl.⁴ ........................................... G01D 15/10
[52] U.S. Cl. ........................... 346/76 L; 219/121.8; 219/121.83; 346/108
[58] Field of Search .............. 219/121.68, 121.69, 219/121.8; 346/76 L, 108

[56] References Cited

U.S. PATENT DOCUMENTS 4,727,381  2/1988  Bille et al. ....................... 346/108

Primary Examiner—C. L. Albritton
Attorney, Agent, or Firm—Neuman, Williams, Anderson & Olson

[57] ABSTRACT

There is disclosed a semiconductor chip and a method of directing a first writing laser beam and a second scanning laser beam across the surface of the semiconductor chip. The semiconductor chip includes first and second edges and a recognition pattern to be scanned by the scanning laser beam to facilitate the control of the relative movement of the semiconductor chip and the writing laser beam. The recognition pattern includes a pair of first enter codes disposed respectively along the first and second edges. Each of the first enter codes includes a synchronization mark and a step recognition mark disposed behind the synchronization mark considering that the scanning laser beam is directed from its edge to first scan the synchronization mark and then the step recognition mark.

7 Claims, 3 Drawing Sheets

APPARATUS FOR AND METHOD OF POSITIONING AND SYNCHRONIZING A WRITING LASER BEAM

CROSS-REFERENCE TO RELATED APPLICATIONS

This application is related to the following commonly assigned, co-pending applications:

(1) U.S. Ser. No. 751,258, filed July 2, 1985, and entitled "METHOD OF, AND APPARATUS FOR, GENERATING A PREDETERMINED PATTERN USING LASER RADIATION", as is incorporated herein by reference; and (2) U.S. Ser. No. 066,369, filed June 25, 1987, and entitled "PROCESS AND DEVICE TO ENHANCE PERFORMANCE ACCURACY IN A LASER WRITING PROCESS", as is incorporated herein by reference

FIELD OF THE INVENTION

This invention relates to apparatus for and a method of positioning and synchronizing a first, writing laser beam with respect to a workpiece in the illustrative form of a semiconductor chip. In particular this invention relates to the use of recognition patterns or entry codes placed in the margin areas of such a chip, which patterns are scanned by a second, scanning laser beam, whereby a reflected part of the scanning laser beam is detected and used to accurately control and synchronize the relative position of the writing laser beam and the chip.

DESCRIPTION OF THE PRIOR ART

In European Patent Publication No. 0,088,045, there is described a method for producing electrically conductive regions in semiconductor chips, and a semiconductor structure of high component density which is produced using this method. During the manufacture of customized chips, there are used commercially available silicon disks or wafers which are provided with P- and N-structures or N- and P-structures at which specific contact surfaces must be produced. These contact surfaces connect these structures and depend on the intended purpose of the chip being produced. There are produced on the silicon disk o wafer electrically conductive regions with standard spaces, which are arranged in accordance with a predetermined raster or grid. Such regions and standard spaces can be obtained, for example, by applying an etching or application technique. Depending on the intended circuit configuration, the conductive region, which may be composed for example of aluminum and disposed intermediate these spaces, is directly or indirectly removed by means of an electron beam or a beam of electromagnetic radiation. Laser radiation in the form of a writing laser beam is particularly suited for this process and the writing laser beam can be positioned and controlled in a simple manner and serves to irradiate a photosensitive layer disposed on the disks. During such processing, the silicon disks or wafers are continuously displaced relative to the writing laser beam along a predetermined raster or grid and the writing laser beam is turned on and turned off by means of a modulator in accordance with the desired removal geometry. A semiconductor structure obtained in accordance with the aforementioned method comprises in its conductive layer, spaces which are arranged according to the predetermined raster or grid and constitute the end points or regions and/or the corner points or regions of insular conductive regions.

In the above identified application U.S. Ser. No. 751,258 (also published as European Patent Publication A1-0 168 351), a laser pattern generator and a process for its operation are described and shown. This laser pattern generator comprises a laser device for generating a writing laser beam and a laser device for generating a scanning or reading laser beam. An electronic system directs the scanning laser bean across the surface of the chip, and the beam reflection therefrom of an intensity varying in accordance with the chip surface, is evaluated by at least one detector. A logic arrangement controls the relative movement of the writing laser beam and the chip. This process and the corresponding laser pattern generator will be explained later in FIGS. 5a and 5b.

SUMMARY OF THE INVENTION

It is an object of this invention to provide apparatus for and a method of positioning and synchronizing the relative movement of a workpiece in the illustrative form of a semiconductor chip and a writing laser beam to achieve even more precise chip component tolerances and to increase the chip processing speed.

In accordance with these and other objects of the invention, there is described a semiconductor chip to be formed by a first writing laser beam directed across a surface thereof and adapted to use a second scanning laser beam as is also scanned across the chip surface. The semiconductor chip has at least two edges intersecting each other and a recognition pattern disposed on said surface and comprising a pair of first enter codes disposed respectively along said first and second edges. Each of the first enter codes includes a synchronization mark and a step recognition mark as follows said synchronization mark, considering that the scanning laser beams scans from the corresponding edge of the chip across the synchronization mark and then the step recognition mark. The first enter codes furnish information for the evaluation of the scanning laser beam as reflected from the surface of the semiconductor chip.

In a further aspect of this invention, the semiconductor chip includes a frame having first and second frame parts intersecting each other to form a corner. The frame encloses a logic circuit formed on the semiconductor chip. There is further included a set of thread codes respectively disposed substantially perpendicular to the longitudinal orientation of the first enter codes respectively. The thread codes are oriented in a direction toward the frame corner and insure that the writing laser beam starts in a corresponding corner of the logic circuit to be formed by the writing laser beam.

In a still further object of this invention, a set of second enter codes is formed respectively within the frame parts and serves to ensure the precise alignment of the writing laser beam with respect to the logic circuit.

In a still further object of this invention, the set of second enter codes is disposed respectively in an outer margin zone of each of the frame parts and is disposed in a substantially parallel relationship with their respective first enter codes. The set of second enter codes is disposed in proximity to the core structure (the so-called gate plane of the semiconductor chip) and, therefore, facilitate an optimal fine correction of the synchronization.

In a still further aspect of this invention, there is disclosed a method of positioning and synchronizing the relative motion of the writing laser beam and the semiconductor chip, including the steps of directing the scanning laser beam from its respective edge across at least one of the first enter code, the thread code or the second enter code, detecting the scanning laser beam as reflected from the surface of said semiconductor chip, and evaluating the reflected scanning laser beam to control the relative movement of the semiconductor chip and the writing laser beam. By so synchronizing the writing laser beam and the semiconductor chip, the writing laser beam may be used in accordance with an "external" indicator pattern to form regions within said semiconductor chip in accordance with a corresponding "internal" pattern.

With respect to the method of this invention, it is advantageous for the scanning laser beam to be guided coaxially with the writing laser beam across the chip surface.

It is also contemplated that the scanning laser beam be guided in front of the writing laser beam across the chip surface.

BRIEF DESCRIPTION OF THE DRAWINGS

These and other objects and advantages of the present invention will become apparent by referring to the following detailed description, and accompanying drawings wherein identical part the same reference numerals.

DESCRIPTION OF THE PREFERRED EMBODIMENT

Figure 4:
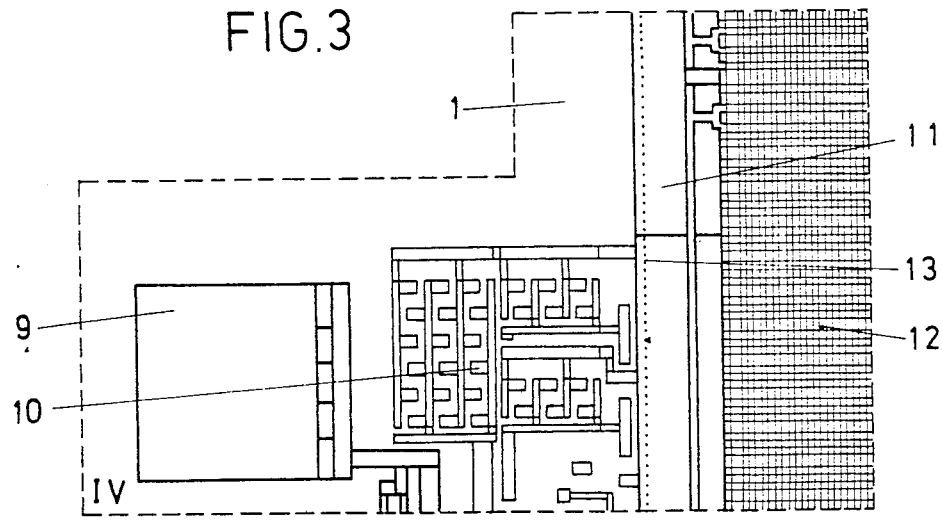
Figures 5A, 5B:
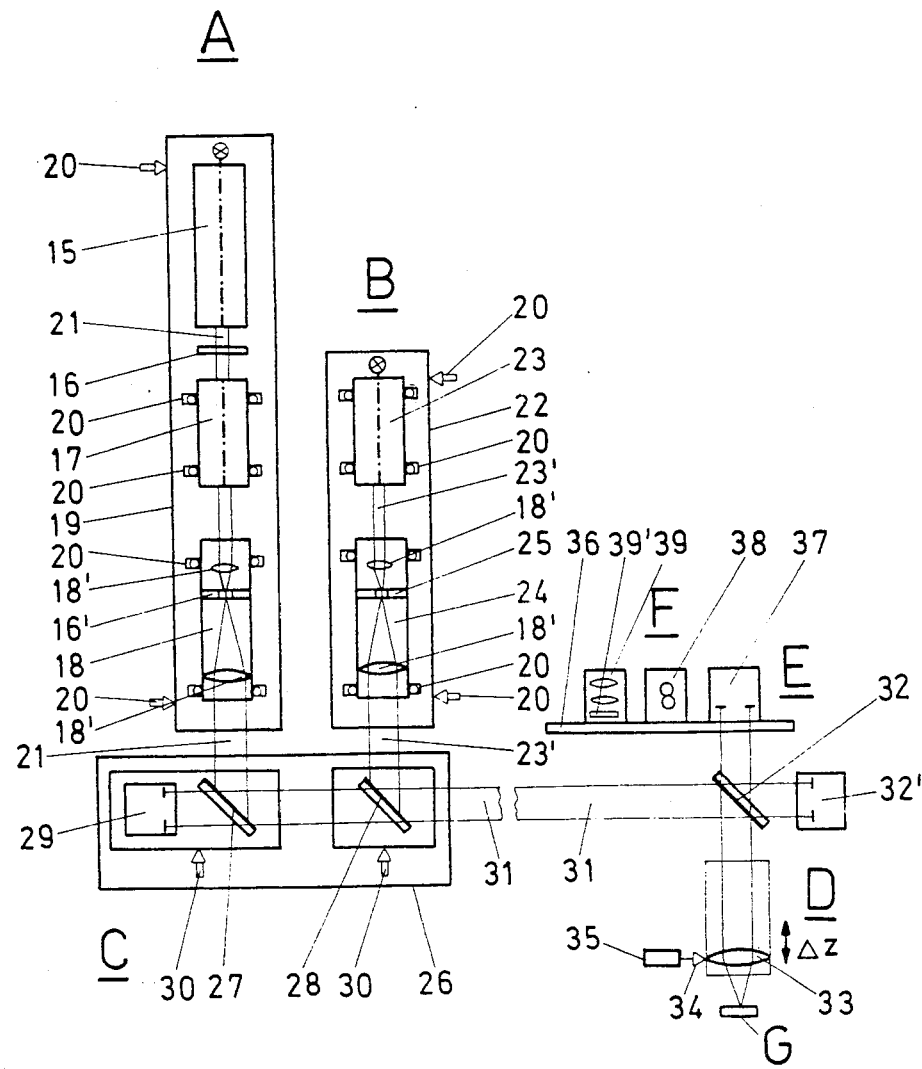
FIGS. 5a and 5b are diagrammatic representations of the laser pattern generator, as disclosed in the above identified application U.S. Ser. No. 751,258, by which the method of this invention can be implemented to produce the semiconductor chip as shown in FIG. 1.

Referring now to the drawings, FIGS. 5a and 5b show a diagrammatic representation of the laser pattern generator as disclosed in the above identified application U.S. Ser. No. 751,258. By means of this generator, a semiconductor chip 1, as will be described with respect to FIGS. 1 to 4, can be processed. There is shown a writing laser beam source A and a scanning laser beam source B, which are arranged in a horizontal position and with parallel optical axes. The writing laser beam source A contains a writing laser device 15, which is followed by a laser beam switch 16 for turning-off the writing laser beam 21 in the open condition of the apparatus. An expander 18 is provided and a pin-hole 16' is arranged in the expander 18. Intermediate the writing laser device 15 and the expander 18, there is positioned a modulator 17 on the optical axis defined in the writing laser source A. The expander 18 contains a lens 18'. The entire writing laser beam source A is mounted in a housing 19. The modulator 17 and the expander 18 are held in the aforementioned housing 19 by means of adjustable mounting or fastening elements 20. The entire housing 19 is also provided with adjustable mounting or fastening elements 20 which permit the correct arrangement of the optical axis of the writing laser beam source A.

The scanning laser beam source B is mounted in a housing 22 and contains a scanning laser device 23 from which a scanning laser beam 23' is directed to an expander 24 of the scanning laser beam source B. This expander 24 also contains a pin-hole 25 in addition to a lens 18'. Other elements already mentioned hereinbefore in the description of the writing laser beam source A are also present in the scanning laser beam source B.

The scanning laser beam 23' emitted by the scanning laser device 23 is directed into the expander 24. The members or components of the scanning laser beam source B are mounted in a housing 22 which, like the housing 19 of the writing laser beam source A, can be correctly positioned by means of adjustable mounting or fastening elements 20.

A laser beam collimator C is disposed to intercept the optical axes of the writing laser beam 21 and of the scanning laser beam 23'. This laser beam collimator C contains, in a housing 26, a beam splitter 27 for the writing laser beam 21 and a mirrow 28 for the scanning laser beam 23'. In FIG. 5a these elements are illustrated in top plan view. These elements are adjustably mounted in the aforementioned housing 26 by means of adjusting or positioning elements 30. On the left-hand side of the beam splitter 27 for the writing laser beam 21, there is located a writing laser beam detector 29 which controls the correct starting position of the writing laser beam 21. The reflected writing laser beam 21 and the reflected scanner laser beam 23' are coaxially superposed or combined into one beam having a common optical axis 31, which is directed towards the arrangement illustrated in FIG. 5b.

As shown in FIG. 5b, this part of the laser pattern generator contains a vertically oriented optical axis as reflected from a beam splitter 32. The common radiation path 31 of the writing laser beam 21 and of the scanning laser beam 23' intercepts the beam splitter 32. A predominant portion of the radiation of the beams 21 and 23' is passed therefrom to a lens 33 of a lens head D and further to a workpiece G, as may illustratively take the form of the semiconductor chip 1 as will be described below in detail. The workpiece G is mounted on a mechanical stage (not shown), which is translated beneath the vertically disposed optical axis in an X direction at speeds of up to 300 mm/sec. After each pass of the common laser beams 21 and 23' in the X direction, the stage is stepped incrementally in the Y direction. This accomplishes a raster-like scan of all or part of the workpiece G. When all the X lines have been scanned, the workpiece G is rotated by 90° and the scan process begins anew to provide scan lines in the Y direction. A scanning laser beam detector 32' is located to follow the beam splitter 32 for the scanning laser beam 23', in the path of the composite writing laser beam 21 and the scanning laser beam 23', which are guided along the common radiation path 31. It is the purpose of this scanning laser beam detector 32' to monitor the position of the radiation path 31.

A lens 33 is provided with an adjusting or positioning elements 34, which is provided with a piezo-electric drive 35. Immediately above the lens head D there is disposed a rotatably mounted turret E. The lens head D and the turret E form a functional unit or an optical module F. The turret E comprises a turret turntable support 36, upon which there are rotatably located in the presently illustrated example a further scanning laser beam detector 37, a shearing-interferometer eyepiece 38 and a microscope eyepiece 39 including a graticule. For safety reasons, the microscope eyepiece 39 is provided with a blocking filter 39' for the writing laser beam 21. For reasons of clarity, the turret E is shown in FIG. 5b in a developed or diagrammatic form.

In the aforedescribed illustrated exemplary embodiment of this invention, the writing laser device 15 comprises a naturally air-cooled helium-cadmium laser system available from Liconix, Sunnyvale, California 94086. This laser device 15 comprises a current regulating high-voltage power supply, Liconix Model 4200 PS, including cold and warm start-up facilities, time program and firing control, as well as a laser device Model 4110B. The main features of the writing laser device 15 are the following: light wavelength 442 nm, light power (continuous) 10 mW, standard intensity distribution over the beam diameter, horizontal polarization direction with deviations of ±5%, and the beam diameter is 1.1 mm.

The scanning laser device 23 may illustratively comprise a naturally air-cooled Melles-Griot helium-neon laser system available from ILEE AG, Schlieren, Switzerland, and which comprises a laser device Model 05-LHP-111 and a power supply Model 05-LPN-340, 1800 V, 6.5 mA. The light wavelength is 633 nm and the light power is 1 $mW_1$. The deviation of the beam axis after cold-start is smaller than 200 μRad and 30 μRad after 15 minutes of operation. The beam divergence amounts to less than 1.3 mRad and the regulation error of the light power is smaller than ±5%.

The modulator 17 constitutes a naturally air-cooled, electrically controlled blue laser-light interrupter system (Coherent Associates, Danbury, Connecticut 06810) and comprises illustratively a control device Model 31 and a modulator Model 3010. The modulator tube contains a refrigerant crystal of potassium dihydrogenephosphate, which is imbedded in a liquid having the same refractive index and which crystal is provided with two control electrodes and a photodiode-light meter attached to the output. The crystal acts in the manner of a polarization filter, the directional angle of which can be rotated through a 90° range by applying a voltage of approximately 600 V.

The expander 18 is composed of two convex lenses and a pin-hole having a diameter of 10 μm and arranged at the common focus of the two convex lenses. The expander 4 increases the diameter and decreases the divergence of the laser beam according to the expansion ratio, i.e. the ratio of the focal point distances, and transmits the image of the light spot within the pin-hole in the output beam. The expander 18 thus, for example, removes dark points which are present in the incoming laser beam and which, for example, are due to dust, and also acts to make the direction of the output beam independent of the direction of the input beam.

A dichroic beam splitter is used as the beam splitter 27 for the writing laser beam 21 and comprises a parallel glass plate with a dielectric metal layer vapordeposited upon one side of the glass plate. This dichroic beam splitter 27 permits the passage of light of a predetermined wavelength, i.e. of a predetermined color, in the same direction when such light impinges thereupon in the throughpass direction. During this passage, the radiation exit point is offset depending on the refractive index of the glass for the predetermined wavelength and depending upon the thickness of the glass plate.

The piezo-electric drive 35 is a conventional drive and comprises, in the illustrated example, a Burley Model PZ70, 1000 V power supply and a Burley Model PZ40 piezo translator. The piezo crystal stack contained therein expands approximately proportional to the voltage applied thereto and displaces thereby the lens 33 along its horizontal axis.

The microscope contains the lens 33 and the microscope eyepiece 39. This lens 33 comprises a convex lens system with or without a standard cover glass on the working side thereof and focuses the concentrically and parallely entering blue and red laser beams to form the smallest possible focal spot at the working distance. The lens 33 furthermore passes an enlarged virtual image of the green-colored illuminated image field extending concentrically with respect to the focal spot and which can be viewed by means of the microscope eyepiece 39. The microscope converts the mechanical displacement by means of the piezo-electric drive 35 into a displacement of the center of the image field and of the center of the focal spot. Thus, the required adjustments in the Z direction may be carried out by an amount delta Z, and in a Y direction may be carried out by an amount delta Y. The extent of the delta Z is indicated by an arrow in FIG. 5b, noting that the shift of delta Y would be orthogonal with respect thereto.

The microscope eyepiece 39 is constructed as a convex lens system and functions as a magnifying lens to provide a magnified visible image from the virtual image produced by the lens 33.

The shearing-interferometer contains a mirrow which can be placed into the radiation path, the parallel glass plate, and the eyepiece 38. This unit constitutes the shearing-interferometer for measuring the deviation of the distance of the reflecting aluminum surface from the focal plane of the lens 33.

The writing laser beam detector 29 and the scanning laser beam detectors 32' and 37 preferably are each comprised of a central or inner, relatively insensitive and an external, more sensitive arrangement of silicon photodiodes. By means of the aforementioned detectors there is determined, on the basis of the laser beam reflected from the workpiece G or on the basis of a laser beam obtained in any other suitable manner, whether the related laser beam is located in the correct position or is spaced in a certain direction from this correct position. The output signals generated by the detectors 29, 32' and 37 are evaluated in order to determine the relative positions of the workpiece G and the writing laser beam 21 and to possibly correct the relative movements of the workpiece G and the writing base beam 21 such as to write a predetermined pattern.

In the semiconductor chip 1 as will be described below with respect to FIGS. 1 to 4, a metalized raster serves as a reference structure. That metalized raster is further shown and described in the above-identified application U.S. Ser. No. 751,258 as a metalized grid disposed upon the surface or regions of the chip 1 and including a first set of evenly spaced, horizontally disposed metal strips, e.g. aluminum, and a second set of evenly spaced metal strips disposed vertically and substantially perpendicular to the strips of the first set. As shown in FIG. 5b, the writing laser beam 21 and the scanning laser beam 23', are focused along path 31 and are directed by the divider 32 vertically to be focused by the lens 33 as a beam spot on the surface of the workpiece wafer G, e.g. the chip 1. The spacing between adjacent strips of the grid amounts to, for example, about 7 μm and their width to, for example, about 5 μm. In such an embodiment of the chip 1, the writing laser device 15 may be, for example, an argon-ion laser having a power in the range of about 1 to about 5 mW at a wavelength of 458 nm and such laser can be obtained, for example, from Spectra Physics, Mountain View, California, Model 162A.07, or from American Laser Corporation, Salt Lake City, Utah, Model 60C. The writing laser device 15 also may be, for example, a helium-cadmium laser having a power in the range of about 7 to about 40 mW at a wavelength of 442 nm or a power in the range of about 1 to about 10 nW at a wavelength of 325 nm. Such laser devices are respectively available and Model 4200 N and Model 4200 NB from Liconix, Sunnyvale, California.

The switching of the continuous laser power is effected by an electro-optical modulator or beam switch 17, for example, Model 3010 produced by Coherent Inc., Modulator Division, Palo Alto, California. The modulator 17 may also constitute an acousto-optical modulator or beam switch, for example, Model 304D produced by the Modulator Division of Coherent Inc. The required switching time is determined by the writing rate and by the local resolution and, for example, may amount to about 2 μs. The subsequent beam expander 18 increases the diameter of the laser beam 21, for example, tenfold. The horizontal writing beam 21 is deflected in a vertical direction by means of the deflection mirror 32. In this example, the lens 33 has a focal length of 18 mm and a diameter of 10 mm. The resulting spot size is about 2 micrometers and the depth of field is about 13 micrometers. The deflection mirrow 27 may be arranged to be controllable or adjustable. The scanning laser device 23 in this example is a He-Ne laser of an output of 1 mw and a beam diameter of 0.65 mm. By means of the expander 24, the scanning laser beam 23' is enlarged 4 times and is superimposed on the writing laser beam 21 by means of the adjustable deflection mirror 28.

Figure 1:
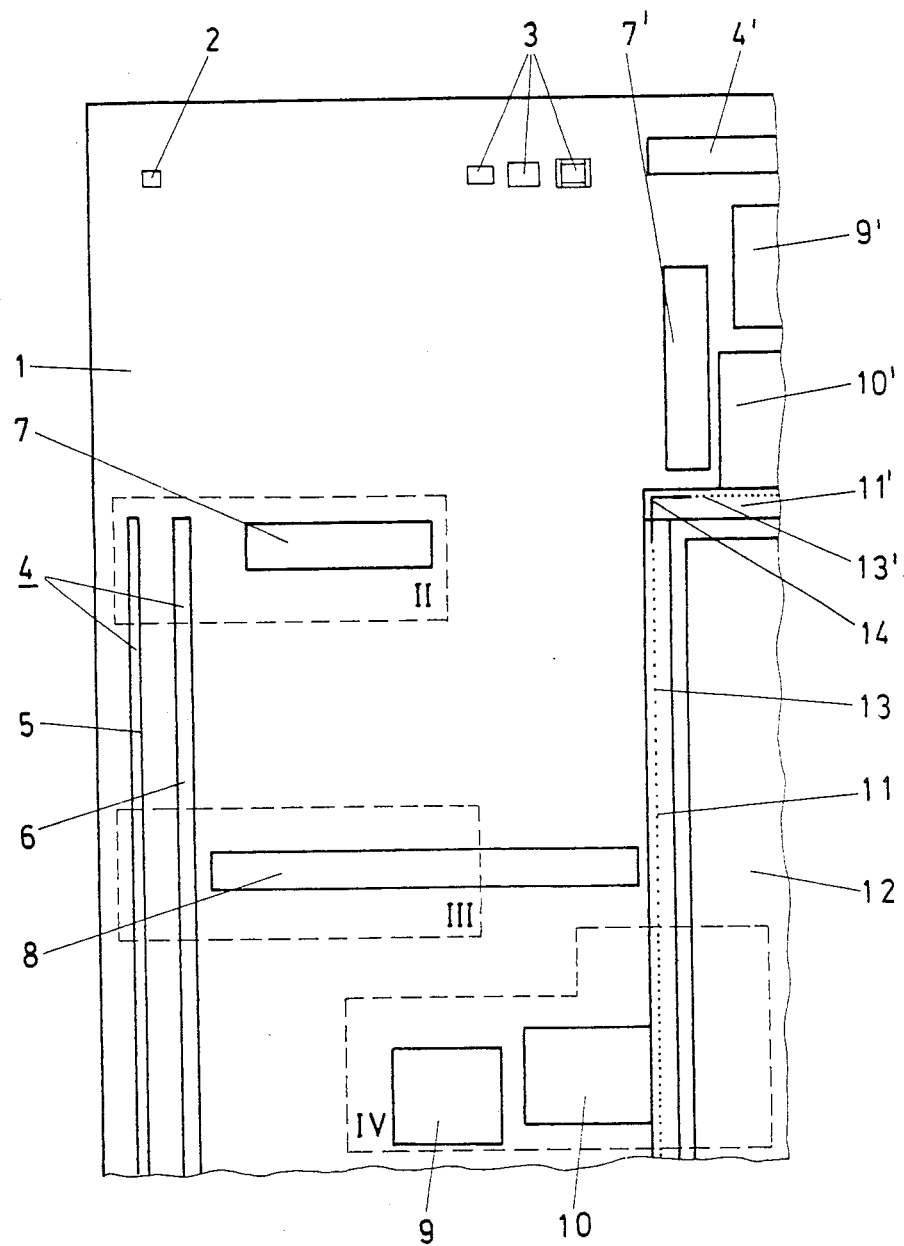
FIG. 1 is a diagrammatic view of a corner of a semiconductor chip according to this invention having a characteristic peripheral structure and an outlined core structure.

The laser pattern generator, as described above with respect to FIGS. 5a and 5b, is used to scan its composite laser beam across the surface of the workpiece G in the illustrative form of the semiconductor chip 1, as will now be described. FIG. 1 shows the chip 1, on the surface of which an adjusting structure 2 and several adjusting elements 3 are disposed. The elements shown on the chip 1 reflect the scanning laser beam 23' (FIGS. 5a and 5b) with varying intensity. Along a first edge of the chip 1 as oriented vertically as shown in FIG. 1, a first enter code 4 is located. In the upper, right hand corner as shown in FIG. 1, a part of another first enter code 4' is shown that extends in parallel with a second edge of the chip 1 as disposed horizontally. The first enter code 4 is composed of two structures that extend in parallel with each other, namely a synchronization mark 5 and of a step recognition mark 6. The objectives of these marks 5 and 6 are indicated by their names, and are used to provide synchronizing and recognition signals as explained more fully in the above identified patent application U.S. Ser. No. 066,369. Perpendicular to the vertical orientation of the first enter code 4, a thread code 7 extends in a direction towards a corner 14 of a frame as comprised of frame part 11 and frame part 11'. The frame encircles a logic circuit 12 to produce by the above described pattern generator. Another thread code 7' extends perpendicular to the other, horizontally oriented enter code 4'. An active field 8 extends also perpendicular to the first enter code 4, the active field 8 usually being generated in block raster font and illustratively containing the name of the client and perhaps the type of logic circuit to be produced. In the lower part of FIG. 1, a first line circuit - PAD -9 is located, while in the upper right-hand corner a second line circuit 9' is disposed. Corresponding input and output structures 10 and 10' are connected with the first line circuits 9 and 9', these structures naturally being connected to the frame parts 11 and 11'. In these frame parts 11 and 11', a second code 13 is located that extends in parallel to the first enter code 4, and another, second enter code 13' is located in parallel with the other first enter code 4'.

Figure 2:
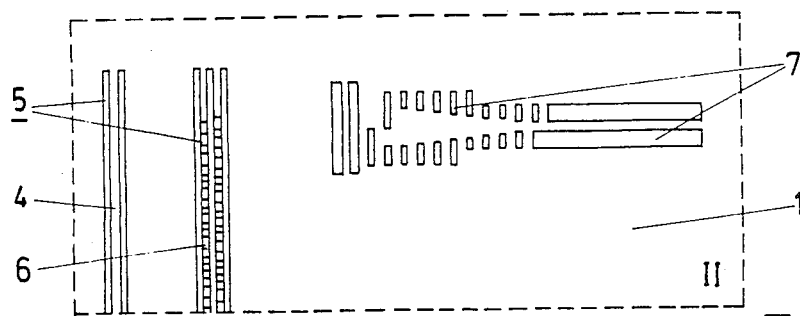
FIG. 2 to 4 are enlarged details II–IV as taken from FIG. 1.

FIG. 2 shows the detail II of the chip 1 from FIG. 1. This enlarged detail contains the upper part of the first enter code 4 with its synchronization mark 5 and its step recognition mark 6 and the top view of the thread code 7. The first enter code 4 supplies the processing information, and the thread code 7 guides the composite scanning laser beam 23' and writing laser beam 21 along in the precise path to the start of the logic circuit 12 to be manufactured. The first enter codes 4 and 4' are used as the laser beams 21 and 23' scan the chip 1 in horizontal and vertically disposed rasters as explained above to produce the required synchronizing and recognition signals, whereby the relative movement between the chip 1 and the composite beams 21 and 23' may be controlled.

Figure 3:
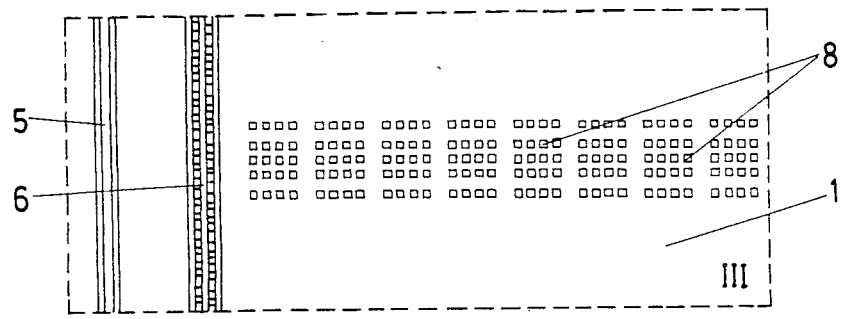

FIG. 3 shows two other cutouts of the synchronization mark 5 and of the step recognition mark 6. In this connection, a part of the active field 8 is shown in diagrammatic form. The objective of the active field 8 was described above.

The enlarged details according to FIG. 4 show the peripheral structure (PAD-field—the first line circuit 9) and, on the right-hand side, the core structure with its gate field 12 (logic). Diagrammatic representations are shown of the line circuit 9 and of the related input and output structure 10. This input and output structure 10 is connected to the frame part 11 and is also connected electrically with the logic circuit 12 located within the frame part 11. At the margin of the frame part 11, the second enter code 13 is located.

Thus, it is seen that the semiconductor chip 1 as disclosed in FIGS. 1 to 4 is processed by the laser pattern generator as shown in FIGS. 5a and 5b. In particular, the writing laser beam 21 and the scanning laser beam 23' are directed along the axis beam path 31 as a composite beam and are thereby reflected by the divider 32, and focused by the lens 33 onto the workpiece wafer G in the form of the semiconductor chip 1. The scanning laser beam 23' is reflected from the surface of the semiconductor chip 1 and is detected by at least the detector 37 to be evaluated as described in the above identified application U.S. Ser. No. 066,369, whereby the relative movement of the semiconductor chip 1 and the writing laser beam 21 may be accurately controlled. Though three different types of codes or reference marks 5, 6 or 7 are shown, it is contemplated that it may not be always necessary to use each of these reference marks to achieve the desired coordination between the relative movement of the writing laser beam 21 and the semiconductor chip 1. As further described in the above identified application U.S. Ser. No. 066,369, the laser pattern generator as shown in FIGS. 5a and 5b is computer controlled and includes a memory in which various patterns are stored and are used to control the pattern or topography of the logic circuit 12 as formed by the writing laser beam 21.

The placement of the recognition patterns on the semiconductor chip 1 in advance of the logic circuitry 12 to be formed by the writing laser beam 21 insures additional time for the laser pattern generator to respond to the reflected scanning laser beam and to control the relative movement of the writing laser beam 21 and the semiconductor chip 1. In addition, the scanning and the "etching" or "denuding" effected by the writing laser beam 21 may be carried out more precisely, whereby the topography of the logic circuitry 12 formed in the semiconductor chip 1 may be more precisely formed. Thus, the method and semiconductor chip of this invention are particularly suited for the manufacture of large numbers, as well as relatively small batches of the semiconductor chips 1.

In considering this invention, it should be remembered that the present disclosure is illustrative only and the scope of the invention should be determined by the appended claims. For example, the laser devices of this invention may be arranged in different orientations than that illustrated in the attached drawings, and the optical paths of the scanning laser and the writing laser beams may be rearranged.

We claim:

1. A semiconductor chip to be formed by a first writing laser beam directed across a surface of said semiconductor chip and adapted to use a second scanning laser beam as is also scanned across said surface, said semiconductor chip comprising:
   (a) first and second intersecting edges; and
   (b) a recognition pattern scanned by said scanning laser beam to provide reflected radiation to be detected and to thereby provide signals for the control of the related movement of said semiconductor chip and said writing laser beam, said recognition pattern including a pair of first enter codes disposed respectively along said first and second edges, each of said first enter codes including a synchronization mark and a step recognition mark.

2. The semiconductor chip as claimed in claim 1, wherein there is further included a logic circuit, a frame confining said logic circuit and having a corner, and a set of thread codes disposed in a substantially perpendicular orientation to the longitudinal direction of said pair of first enter codes and extending along a direction toward said corner.

3. The semiconductor chip as claimed in claim 2, wherein said frame comprises a first part disposed substantially parallel with respect to said first edge and a second part disposed substantially parallel with respect to said second edge, and there is included a set of second enter codes associated respectively with said first and second frame parts.

4. The semiconductor chip as claimed in claim 3, wherein said second enter codes extend on an outer marginal zone of each of said first and second frame parts and are respectively disposed substantially parallel to said first enter codes of said pair.

5. A method for positioning and synchronizing said writing laser beam with respect to said semiconductor chip as claimed in claim 3, wherein said method comprises the steps of:
   (a) scanning with said scanning laser beam across at least one of said pair of first enter codes, said set of thread codes, or said set of second enter codes;
   (b) detecting said scanning laser beam as reflected from said surface of said semiconductor chip; and
   (c) evaluating said reflected scanning laser beam to control the relative movement of said semiconductor chip and said writing laser beam.

6. The method as claimed in claim 5, wherein said scanning laser beam and said writing laser beam are directed coaxially of each other onto said surface of said semiconductor chip.

7. The method as claimed in claim 5, wherein said scanning laser beam is scanned in front of said writing laser beam considering the direction of the scan across said surface of said semiconductor chip.

* * * * *